(12) United States Patent
Dhayni

(10) Patent No.: US 9,008,595 B2
(45) Date of Patent: Apr. 14, 2015

(54) TESTING METHOD DETECTING INCORRECTLY CONNECTED ANTENNA CONTACTS

(75) Inventor: Achraf Dhayni, Vallauris (FR)

(73) Assignee: St-Ericsson SA, Plan-les-Ouates (CH)

( * ) Notice: Subject to any disclaimer, the term of this patent is extended or adjusted under 35 U.S.C. 154(b) by 143 days.

(21) Appl. No.: 13/604,776

(22) Filed: Sep. 6, 2012

(65) Prior Publication Data

US 2013/0244583 A1  Sep. 19, 2013

Related U.S. Application Data

(60) Provisional application No. 61/554,633, filed on Nov. 2, 2011.

(30) Foreign Application Priority Data

Sep. 16, 2011  (EP) .................................. 11306174

(51) Int. Cl.
*H03C 1/62* (2006.01)
*H04B 17/00* (2006.01)
*G01R 29/10* (2006.01)
*H04B 1/04* (2006.01)
*G01R 31/04* (2006.01)

(52) U.S. Cl.
CPC ................ *H04B 17/00* (2013.01); *G01R 29/10* (2013.01); *H04B 17/0032* (2013.01); *G01R 31/041* (2013.01); *H04B 17/0012* (2013.01)

(58) Field of Classification Search
CPC .......................... H04B 17/0007; H03G 3/3042
USPC ............................................. 455/115.1, 226.1
See application file for complete search history.

(56) References Cited

U.S. PATENT DOCUMENTS

2006/0197538 A1 * 9/2006 Leinonen et al. ............. 324/533

* cited by examiner

*Primary Examiner* — Lee Nguyen
(74) *Attorney, Agent, or Firm* — Patent Portfolio Builders PLLC

(57) ABSTRACT

The invention concerns a testing method detecting misconnected mechanical contacts between off-chip antenna and on-chip antenna circuit, wherein the testing method is a Built-In Self-Test method including a step of measuring at least one electrical parameter of on-chip antenna circuit connected to off-chip antenna which is representative of state of connection of said mechanical contacts.

16 Claims, 2 Drawing Sheets

TESTING METHOD DETECTING INCORRECTLY CONNECTED ANTENNA CONTACTS

FIELD OF THE INVENTION

The invention relates to testing methods detecting incorrectly connected contacts between off-chip antenna and on-chip antenna circuit.

BACKGROUND OF THE INVENTION

There exist several concepts of testing methods detecting incorrectly connected contacts between off-chip antenna and on-chip antenna circuit. All these existing techniques have been developed for testing state of connection of electrical contacts. Electrical contacts are for example soldered contacts between off-chip antenna and on-chip antenna circuit. All these existing testing concepts present weaknesses.

According to one of these testing concepts, antenna circuit impedance is measured. A peak detector is used that is integrated in the power amplifier block of the transmitter. The peak voltage of the transmitted signal is measured on-chip. By measuring the peak voltage, the load impedance at the antenna circuit connection pads is calculated and verified against the specified range to check whether the antenna circuit is present or not, that is to say whether electrical contacts between off-chip antenna and on-chip antenna circuit are well soldered or not.

According to another one of these testing concepts, the transmitter output power is measured. The device is programmed to radiate a known output power, and then to measure with the spectrum analyzer this output power taking into account the over-the-air antenna to antenna loss. Here, the spectrum analyzer plays the role of a receiver. A measured output power below the programmed value means that there is a problem with the antenna circuit connection. This method needs extra equipments like a spectrum analyzer and its antenna.

According to another one of these testing concepts, either the signal or the signal to noise ratio, of the receiver is measured. A continuous wave signal is radiated to the antenna of the receiver. The resulting signal level and frequency offset are measured using an on-chip design for testability in the receiver circuit. A measured input power below the transmitted value, or a measured frequency offset higher than that specified by the design, means that the antenna circuit is not well connected. This method needs extra equipments like a radio frequency signal generator and its antenna.

According to another one of these concepts, a RX/TX loopback is used. As an example, let us take the case of an FM transceiver. The transmitter output is a frequency modulated single tone, with, for example, carrier frequency at 87.5 MHz. The antenna voltage is fed through a matched attenuator to the internal LNA input. At the output of the LNA, the signal strength is measured in the level detector block. The measured value is compared to a lower limit. In case the measured value is above the lower limit, this means that the antenna circuit connections are correct. If the measured value is below the lower limit, then the antenna connections are not correct. The bad quality factor caused by the absence of the antenna circuit attenuates the transmitted signal level. Hence, the lower received signal strength value.

Due to manufacturing needs, mobile phone manufacturers want to use mechanical structure where the antenna circuit, that is to say the antenna and its matching and filtering circuits, is connected to the phone with mechanical contacts instead of electrical contacts, for example spring contacts instead of soldering.

Badly connected antenna mechanical contact may cause a situation where the phone works somehow in a good network in big cities and poorly in the countryside where there is lower signal strength. This is very hard to detect using the production tests and Built-in Self-Test techniques known in prior art.

As well, this is very hard to detect in the service center where consumer walks in, because walk-in service centers are usually in good network coverage area and everything seems to be fine even when the antenna circuit is disconnected.

SUMMARY OF THE INVENTION

The object of the present invention is to alleviate at least partly the above mentioned drawbacks.

More particularly, the invention aims to detect not correctly connected mechanical contacts between off-chip antenna and on-chip antenna circuit. On-chip antenna circuit is also called transceiver on-chip circuit. Off-chip antenna may comprise antenna itself and matching circuit.

With electrical contacts, for example with soldering, either the contacts make the connection between off-chip antenna and on-chip antenna circuit or they don't.

According to an embodiment of the invention, it has been noticed that with mechanical contacts, for example with spring contacts, situation can be different from either fully connected state or fully unconnected state, that is to say we can have a so-called "in between" situation where contacts make a connection but an imperfect connection. This imperfect connection may work in certain use conditions and may not work in other use conditions.

So, providing a testing method, according to an embodiment of the invention, that is able to detect this imperfect connection, and not only either good connection or absence of connection, is interesting.

Providing such a testing method as a Built-in Self-Test (BIST) method is even more interesting, because of the advantages of BIST methods. According to an embodiment of the invention, it has been noticed that electrical parameter that are measured in BIST methods according to prior art fail to help making a correct diagnosis about state of connection, because the chosen measured electrical parameter is not representative of imperfect connection, the chosen measured electrical parameter can only help discriminating between good connection and absence of connection. BIST methods according to prior art, if applied to mechanical contacts could only detect total absence of connection, which is a minor proportion of bad connection cases with mechanical contacts, and not imperfect connection, which is a major proportion of bad connection cases with mechanical contacts.

According to an embodiment of the invention, there is a focus on a BIST technique with a superior coverage, as compared to traditional techniques, for achieving a short test time, accurate fault detection and fast repairing of badly connected antenna mechanical contacts. This BIST technique focuses on measuring another electrical parameter that would be representative of imperfect connection, contrary to the electrical parameters measured with prior art techniques that are only representative of absence of connection (or good connection).

According to an embodiment of the invention, part of transfer function of on-chip antenna circuit connected to off-chip antenna would be used because it is representative of imperfect connection.

According to an embodiment of the invention, the BIST method also allows high testing/testability reuse which is useful for guaranteeing cost-effective tests over the different platforms and different testing areas in research and development.

According to an embodiment of the invention, it has been noticed that the above mentioned cheap and fast testing concepts according to prior art have proved insufficient test coverage to detect a defective antenna mechanical contact. It has been noticed that, unlike the traditional defective soldering contact, which is an electrical contact, a defective antenna spring contact, which is a mechanical contact, may change its transfer function; it may detune the resonance of the antenna circuit and/or may change its quality factor, more than changing its impedance or its output signal amplitude.

Indeed, detuning the resonance of the antenna circuit may cause a nonlinear gain in the bandwidth of the received and transmitted signals. Under certain conditions, for example with a poor network, this drives the circuit to a faulty behavior without changing the overall gain of the signal. That is why, it may be less efficient to cover this kind of faults by applying testing methods that rely on impedance and power measurements and frequency offset measurement as the ones mentioned above in prior art discussion.

Indeed, changing the quality factor may cause different transient times in the received and transmitted signals. Under certain conditions, for example very strong or very weak signals, this drives the circuit to a faulty behavior without any systematic change in load impedance and/or in the power of the signal. This is why it may be less efficient to cover this kind of faults by applying test methods that rely on impedance and power measurements as the ones mentioned in prior art discussion.

According to an embodiment of the invention, the state of connection of mechanical contacts between off-chip antenna and on-chip antenna circuit is considered from a different point of view than the existing techniques of prior art. BIST technique is performed by measuring on-chip at least an electrical parameter that is representative of imperfect connection, for example quality factor QF and/or resonance frequency RF of the on-chip antenna circuit connected to off-chip antenna, rather than testing by measuring the impedance, frequency offset, and/or the signal strength as in prior art techniques.

According to an embodiment of the invention, it is provided a full BIST method that is to say with no external components at all and with all the method taking place on-chip.

According to an embodiment of the invention, provided BIST method has superior test coverage sufficient to detect faults that may only appear when the network is weak, for example emerging faults due to bad antenna circuit mechanical contacts.

According to an embodiment of the invention, it is the most accurate method to test the good assembly of the off-chip antenna after being fixed via mechanical structures to the on-chip transceiver circuit.

According to an embodiment of the invention, this concept can be generalized to be applied to any circuit that contains an on-PCB antenna circuit.

This object is achieved with a testing method detecting misconnected mechanical contacts between an off-chip antenna and an on-chip antenna circuit, wherein the testing method is a Built-In Self-Test method including a step of measuring at least one electrical parameter of the on-chip antenna circuit connected to the off-chip antenna which is representative of the state of connection of said mechanical contacts.

This object is also achieved with an on-chip antenna circuit comprising mechanical contacts adapted to be connected to an off-chip antenna, wherein the on-chip antenna circuit comprises interconnected components adapted to operate in an operating mode and adapted to perform a Built-In Self-Test method including a step of measuring at least one electrical parameter of the on-chip antenna circuit connected to the off-chip antenna which is representative of the state of connection of said mechanical contacts in a testing mode distinct from said operating mode.

Preferred embodiments comprise one or more of the following features:

According to an embodiment of the invention, said electrical parameter is at least part of a transfer function of the on-chip antenna circuit connected to the off-chip antenna.

According to an embodiment of the invention, the testing method includes a step of evaluating the quality factor and/or the resonance frequency of the on-chip antenna circuit connected to off-chip antenna, from the measured transfer function.

According to an embodiment of the invention, the testing method includes a step of evaluating the quality factor and the resonance frequency of the on-chip antenna circuit connected to the off-chip antenna, from the measured transfer function.

According to an embodiment of the invention, said measuring step includes a substep of generating and sweeping carrier frequencies over a predetermined frequency range at an input of a transmitter of the on-chip antenna circuit and a substep of measuring an electrical signal amplitude at an output of a receiver of the on-chip antenna circuit.

According to an embodiment of the invention, the substep of sweeping carrier frequencies, is performed over a frequency range that is broader than the maximal resonance frequency detuning range of the on-chip antenna circuit being misconnected to the off-chip antenna.

According to an embodiment of the invention, in the substep of sweeping carrier frequencies, a frequency step is separated from the subsequent frequency step by a time interval longer than T, with T=QF/RF, and with QF being the theoretical value of the quality factor and RF being the theoretical value of the resonance frequency of the on-chip antenna circuit well connected to the off-chip antenna.

According to an embodiment of the invention, in the substep of sweeping carrier frequencies, the frequency step resolution is smaller than the frequency interval that would lead to a 0.1 dB quality factor shift.

According to an embodiment of the invention, said off-chip antenna is a Near Field Communication antenna.

According to an embodiment of the invention, the testing method includes a step of assessing the state of connection of said mechanical contacts by comparing at least one measured electrical parameter with at least one theoretical electrical parameter corresponding to a good connection between the off-chip antenna and the on-chip antenna circuit.

According to an embodiment of the invention, the on-chip antenna circuit comprises:
- a transmitter, adapted to transmit a signal to an off-chip antenna connected to an on-chip antenna circuit, both in operating and testing modes,
- a receiver, adapted to receive a signal from an off-chip antenna connected to an on-chip antenna circuit, in operating mode,
- a numerically controlled oscillator, adapted to generate and sweep carrier frequencies over a predetermined frequency range, in testing mode.

According to an embodiment of the invention, the receiver of the on-chip antenna circuit comprises:
- an input, adapted to be connected to an off-chip antenna, both in operating and testing modes,
- a mixer, adapted to mix signal from said input with a signal from a numerically controlled oscillator, in order to down-modulate said signal from said input to a baseband signal, both in operating and testing modes,
- an envelope detector, adapted to filter signals from a mixer, in order to extract baseband signals, in both operating and testing modes,
- an analogue-to-digital converter, adapted to receive signals from said envelope detector, both in operating and testing modes,
- an output, adapted to receive signals from the analogue-to-digital converter, in both operating and testing modes.

According to an embodiment of the invention, the transmitter is adapted to have its driver current replicated at the input of the receiver via a current mirror, in testing mode.

According to an embodiment of the invention, on-chip analogue components of the on-chip antenna circuit, used in testing mode, are also used in operating mode.

In an embodiment of the invention, the mechanical contacts are spring contacts.

Further features and advantages of the invention will appear from the following description of embodiments of the invention, given as non-limiting examples, with reference to the accompanying drawings listed hereunder.

DETAILED DESCRIPTION OF THE INVENTION

Figure 1:
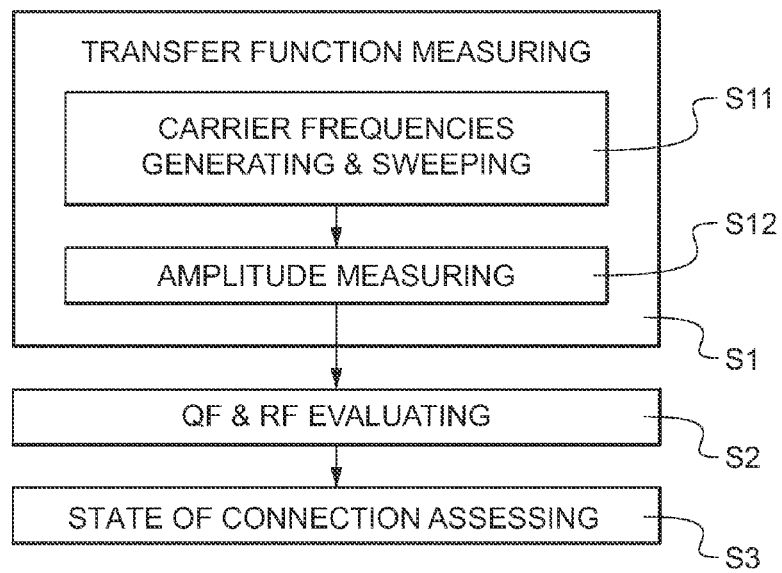
FIG. 1 shows an example of a testing method according to an embodiment of the invention.

FIG. 1 shows an example of a testing method according to an embodiment of the invention. BIST method comprises several successive steps. First a transfer function measuring step S1, then a QF (quality factor) and RF (resonance frequency) evaluating step S2, and afterwards a state of connection assessing step S3. Transfer function measuring step S1 is subdivided in two substeps S11 and S12.

In substep S11, there are generated carrier frequencies, with a sweeping of those carrier frequencies over a predetermined frequency range. This predetermined frequency range is chosen broad enough to cover a sufficient portion of the transfer function including the effective resonance frequency that can be shifted relatively to the theoretical resonance frequency which corresponds to ideal connection between ideal circuit and ideal antenna. In substep S11, generating and sweeping carrier frequencies over a predetermined frequency range takes place at the input of a transmitter of on-chip antenna circuit. In substep S11, carrier frequencies sweeping is preferably performed over a frequency range that is broader than the maximal resonance frequency detuning range of on-chip antenna circuit misconnected to off-chip antenna, as will be explained in detail with respect to FIG. 4. In substep S11, a frequency step is preferably separated from the subsequent frequency step by a time interval longer than T, with T=QF/RF, and more preferably by a time interval longer than T, with T=1.5 QF/RF, and with QF theoretical value of quality factor and RF theoretical value of resonance frequency of on-chip antenna circuit well connected to off-chip antenna, as will be explained in detail with respect to FIG. 3. In substep S11, the frequency step resolution is preferably smaller than the frequency interval that would lead to a 0.1 dB quality factor shift, as will be explained in detail with respect to FIG. 4.

In substep S12, for each frequency step, corresponding signal amplitude is measured at output of receiver of on-chip antenna circuit. The curve obtained by these amplitudes as a function of swept carrier frequencies is part of transfer function. The measured electrical parameter of on-chip antenna circuit connected to off-chip antenna is chosen in substep S12 so as to be representative of state of connection of said mechanical contacts, and more particularly so as to be representative of imperfect state of connection of said mechanical contacts, that is to say connection state "in between", between good connection and absence of connection. This electrical parameter is preferably at least part of transfer function of on-chip antenna circuit connected to off-chip antenna. This electrical parameter is more preferably the amplitude of the transfer function itself. This amplitude of the transfer function is the amplitude of the signal at the output of the digital low pass filter, which is equal to the envelop of the current mirrored received radio frequency signal. In substep S12, measuring electrical signal amplitude takes place at the output of a receiver of on-chip antenna circuit.

Figure 4:
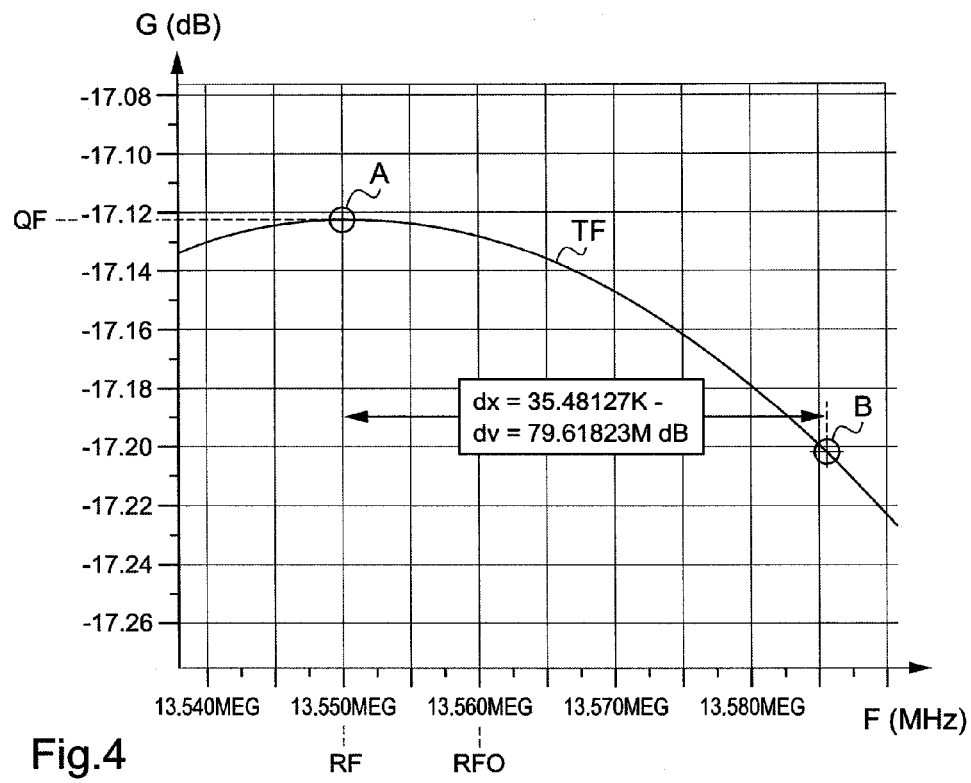
FIG. 4 shows an example of diagram representing variations of amplitudes measured at the output of receiver of on-chip antenna circuit according to an embodiment of the invention.

In step S2, QF and/or RF are extracted from measured curve in step S1, by calculation, described in more detail with respect to FIG. 4. Extracting both QF and RF is better, since more situations of imperfect connection will be covered that way. If, for example, only QF or RF are needed, other measurements can be performed that don't need measuring the complete transfer function.

In step S3, assessing state of connection of said mechanical contacts is performed by comparing at least one measured electrical parameter with at least one theoretical electrical parameter corresponding to good connection between off-chip antenna and on-chip antenna circuit. In step S3, state of connection is assessed from extracted QF and RF. Discrimination is made between shifts in QF and/or in RF that are caused by imperfect connection and shifts in QF and/or in RF that have another cause, for example metallic objects in vicinity for NFC application, or acceptable variations of component characteristics according to tolerance manufacturing, or unacceptable deficient components in on-chip antenna circuit, and so on . . . . In order to perform such a discrimination in an optimized way, measuring amplitude over a broad frequency range, allowing to get a more substantial range of transfer function with respect to frequency, is clearly more advantageous.

This BIST method can be applied to the situation where the antenna is a Near Field Communication antenna.

Figure 2:
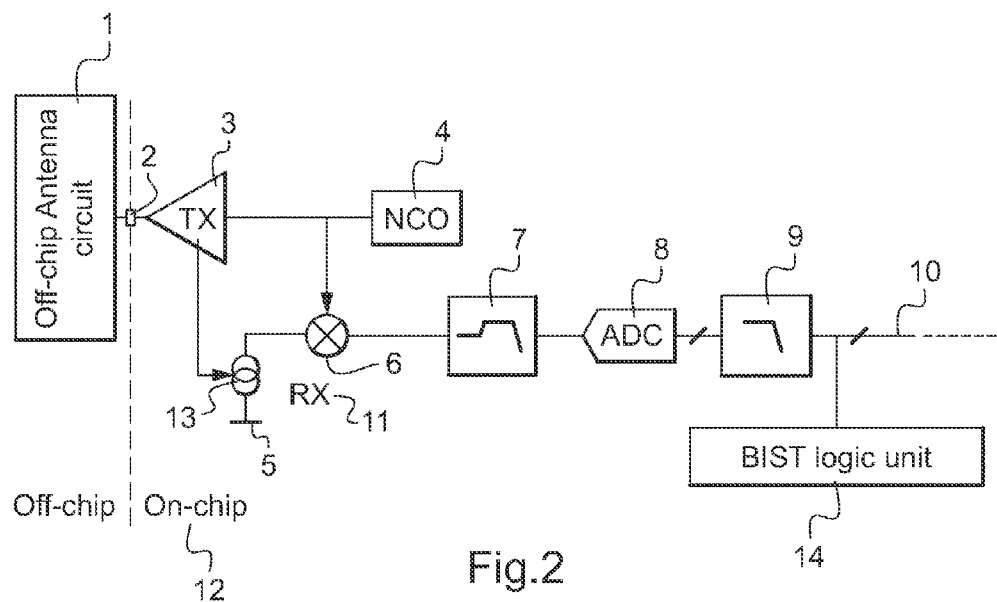
FIG. 2 shows schematically an example of an on-chip antenna circuit connected to an off-chip antenna according to an embodiment of the invention.

FIG. 2 shows schematically an example of an on-chip antenna circuit connected to an off-chip antenna according to an embodiment of the invention. This system may be used to perform BIST method described in FIG. 1, in a testing mode whereas it can work the usual way in an operating mode. An on-chip antenna circuit 12 is connected to an off-chip antenna 1 via mechanical contacts 2. Part of these mechanical contacts 2 belong to on-chip antenna circuit 12, whereas part of these mechanical contacts 2 belong to off-chip antenna 1.

On-chip antenna circuit 12 comprises mechanical contacts 2 adapted to be connected to an off-chip antenna 1. The on-chip antenna circuit 12 comprises together connected components 3, 4, 6, 7, 8, 9, 13, 14 that are adapted to operate in an operating mode on the one side and that are adapted to perform a Built-In Self-Test method including a step of measuring at least an electrical parameter of on-chip antenna circuit 12 connected to off-chip antenna 1 which is representative of state of connection of said mechanical contacts 2 in a testing mode distinct from operating mode, on the other side.

On-chip antenna circuit 12 further comprises a transmitter 3, a receiver 11, and a numerically controlled oscillator 4. The transmitter 3 is adapted to transmit a signal to an off-chip antenna 1 connected to on-chip antenna circuit 12, both in operating and testing modes. The receiver 11 is adapted to receive a signal from an off-chip antenna 1 connected to on-chip antenna circuit 12, in operating mode. The numerically controlled oscillator 4 is adapted to generate and sweep carrier frequencies over a predetermined frequency range, in testing mode. The numerically controlled oscillator 4 is also needed in normal operation in the Near Field Application for example; it is used for "low power tag detection" NFC mode.

Receiver 11 comprises an input 5, a mixer 6, an envelope detector 7, an analogue-to-digital converter 8, a digital low pass filter 9, an output 10, and a BIST logic unit 14. The input 5 is adapted to be connected to off-chip antenna 1, both in operating and testing modes. The mixer 6 is adapted to mix signal from input 5 with signal from numerically controlled oscillator 4, in order to down modulate signal coming from input 5 to a baseband signal, both in operating and testing modes. The envelope detector 7 is adapted to filter signal from mixer 6, in order to extract baseband signal, both in operating and testing modes. The analogue-to-digital converter 8 is adapted to receive signal from envelope detector 7, both in operating and testing modes. The output 10 is adapted to receive signal from analogue-to-digital converter 8. In testing mode, transmitter 3 driver current is mirrored at the input 5 of receiver 11 via a current mirror 13.

Numerically controlled oscillator 4 output is connected to transmitter 3 input and to one of mixer 6 inputs. Input 5 of receiver 11 is connected to another of mixer 6 inputs. Output of mixer 6 is connected to input of envelop detector 7. Input of envelop detector 7 is connected to input of analogue-to-digital converter 8. Output of analogue-to-digital converter 8 is connected both to output 10 of receiver 11 and to input of BIST logic unit 14. BIST logic unit 14 is adapted to extract from measured transfer function TF, the maximum amplitude value of TF which is QF and the frequency for which it happens which is RF.

On FIG. 2, we can see that all on-chip analogue components of on-chip antenna circuit used in testing mode, which are mixer 6, envelop detector 7 and analogue-to-digital converter 8, and are also used in operating mode. And apart from BIST logic unit 14, all on-chip digital components of on-chip antenna circuit used in testing mode are also used in operating mode. So there is no need of any extra analogue silicon and nearly no need of any extra digital silicon for implementing blocks for BIST purpose only.

In a transmitter 3 to receiver 11 loopback mode, that is to say in the testing mode, the transmitter 3 generates a non-modulated carrier signal. In the transmitter 3, the frequency of this non-modulated carrier is swept by stepping the frequency of the numerically controlled oscillator 4 over a broad frequency range around the resonance frequency of the on-chip antenna circuit 12 connected to the off-chip antenna 1. Due to the resonance behavior of the on-chip antenna circuit 12, the frequencies near resonance will be amplified according to the quality factor QF of the on-chip antenna circuit 12 connected to the off-chip antenna 1. On the other hand, this amplification is sensed at the output 10 of the receiver 11 circuit in order to measure the resonance frequency RF and the quality factor QF of on-chip antenna circuit 12 connected to the off-chip antenna 1. At the end, if the resonance frequency RF and the quality factor QF are within specification, that means that the on-chip antenna circuit 12 is well connected to off-chip antenna 1, even in the case of contacts 2 that are mechanical contacts 2.

Figure 3:
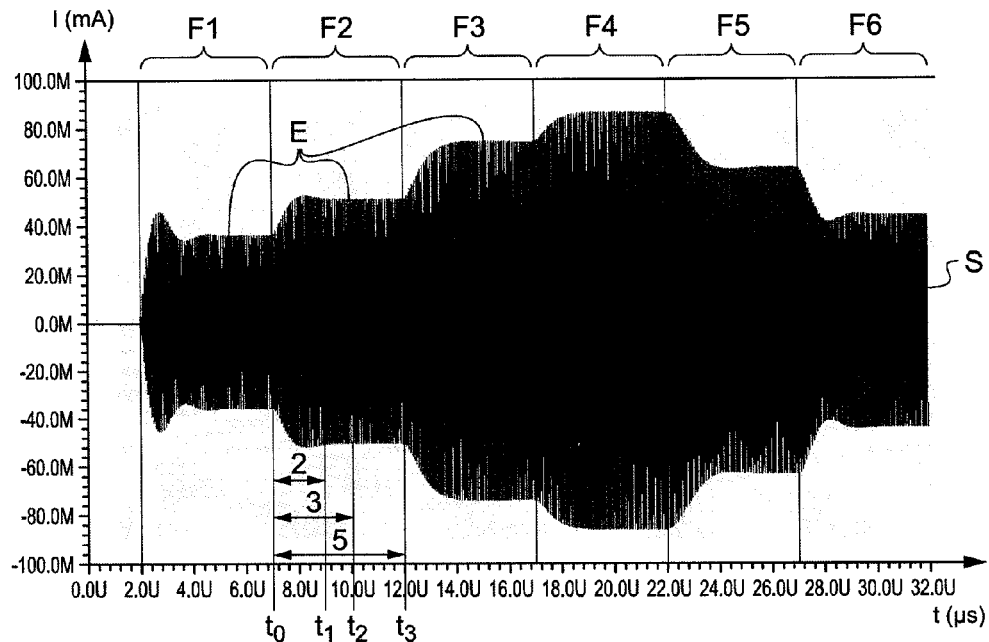
FIG. 3 shows an example of variations of transmitter driver current mirrored at the input of receiver of on-chip antenna circuit according to an embodiment of the invention.

During the testing mode, which is a BIST mode, the transmitter 3 driver current is replicated, via a current mirror 13, in the receiver 11. The mirrored current is mixed with the carrier frequency in mixer 6 to down-modulate it to the baseband signal. In order to measure the resonance frequency RF and quality factor QF of the on-chip antenna circuit 12 connected to the off-chip antenna 1 through the pad 2, the transmitter 3 should generate a frequency swept sine, using the numerically controlled oscillator 4, and the frequency swept signal will be mixed with itself, in the receiver 11, to detect the current drive level as a DC component in receiver 11, as shown in FIG. 3 below. For the testing mode, the mixer 6 should be fed from the numerically controlled oscillator 4 output to create DC baseband and 2×RadioFrequency component images of the received signal, generated by the transmitter 3, which is why it is a loopback method, at the mixer 6 output. After transient settling, the DC component is to be evaluated in the digital domain.

In normal operating mode, the mixer 6 is fed with a fixed carrier frequency and the mixer 6 output consists of DC baseband received signal and of the spectrum at twice the resonance frequency RF. This fixed carrier frequency comes from the numerically controlled oscillator 4. The baseband part is selected and can be amplified by the envelope detector 7, which filters off high-frequency components and attenuates low-frequency components, here low-frequency being less than 1.3 kHz. The low-frequency attenuation is obtained from a feedback over the analogue low pass filter LPF included in the envelop detector 7, creating a zero at 1.3 kHz in the frequency response of the analogue LPF. After analogue-to-digital converter 8, a digital low pass filter LPF filters off 2×RadioFrequency component.

FIG. 3 shows an example of variations of transmitter driver current mirrored at the input of receiver of on-chip antenna circuit according to an embodiment of the invention. Mirrored transmitter driver current I, more simply called mirrored current I, has its value which is plotted as a function of time t. Mirror current value I is expressed in mA (milli Ampere). Time t is expressed in microseconds (µs).

Mirrored current I is shown by signal S which has a time varying carrier frequency as well as an envelop E. Signal S shows mirrored current I from continuous-phase stepped frequency. As a function of time t, carrier frequency varies step by step. Carrier frequency starts at F1=13.0 MHz and stays more or less constant for about 5 µs. Then, carrier frequency jumps at F2=13.2 MHz and stays more or less constant for about 5 µs. Then, carrier frequency jumps at F3=13.4 MHz and stays more or less constant for about 5 µs. Then, carrier frequency jumps at F4=13.6 MHz and stays more or less constant for about 5 µs. Then, carrier frequency jumps at F5=13.8 MHz and stays more or less constant for about 5 µs. Then, carrier frequency jumps at F6=14.0 MHz and stays more or less constant for about 5 µs. For each frequency step, but it is only shown for second carrier frequency step F2 on FIG. 3, we can observe several successive time intervals. At $t_0$, carrier frequency is changed. Between $t_0$ and $t_1$, during about 2 μs, there is an oscillation in the envelop E. Between $t_1$ and $t_2$, during about 1 μs, there is a progressive stabilization of envelop E. Between $t_2$ and $t_3$, after a duration of 3 μs, envelop E appears to be stabilized. At $t_3$, carrier frequency changes again, and we enter a new cycle.

After each carrier frequency step, F1 to F6, the circuit must be given time to settle before acquiring a stabilized transmitter driver current value. This is illustrated in FIG. 3, where in 5 μs intervals, carrier frequency is stepped around the on-chip antenna circuit connected to off-chip antenna resonance frequency RF. RF is about 13.56 MHz, since we are taking the case of a NFC application. According to the design specification, the resonance frequency RF is at 13.56 MHz with a quality factor QF of 27. A rough rule of thumb would be that the circuit needs around QF signal periods to settle. Being of QF=27 in this case, at least 2 μs are needed by the circuit to settle. As can be seen in FIG. 3, the circuit should be given a little more time to settle: about 3 μs for 200 kHz step size.

FIG. 4 shows an example of diagram representing variations of amplitudes measured at the output of receiver of on-chip antenna circuit according to an embodiment of the invention. The amplitude of envelop E seen on FIG. 3 is here plotted as a function of varying carrier frequency, what gives the transfer function TF of on-chip antenna circuit 12 connected to antenna 1. FIG. 4 shows this TF plotting the gain G as a function of carrier frequency F. The gain G is expressed in dB. The frequency F is expressed in MHz. The TF curve is extrapolated from many measured points.

On FIG. 4, we can see two measured points A and B. Gain G happens to be maximal for frequency F value about 13.55 MHz. Quality factor QF is the gain value at the resonance frequency RF. Resonance frequency RF is very close to theoretical resonance frequency RF0. Quality factor QF is also very close to the theoretical expected value. Such very small noticed differences may simply come from components manufacturing tolerances, certainly not from an imperfect mechanical connection. We can deduce from this good correspondence between measured QF and RF values and theoretical QF and RF values that on-chip antenna circuit 12 is well connected to off-chip antenna 1 through mechanical contacts 2. If shifts in RF and/or in QF would have been bigger, then depending on the shift values, a risk assessment of "bad mechanical connection" could have been done.

To get a sufficiently accurate evaluation of TF, the required frequency step resolution depends on the QF of the on-chip antenna circuit connected to off-chip antenna. To maximize fault coverage, the detection scheme should be robust versus detuning from badly connected mechanical contacts. From this, frequency detuning of the peak would preferably be caught with an accuracy superior to the required amplitude detection accuracy being about 0.1 dB.

Back to our case study where QF=27 shown on FIG. 4, the maximum variations that results from this QF of 27 shifts to −0.06 dB of its maximum peak value within 30 kHz, and to −0.08 dB of its peak value within 35 kHz. Thus a frequency step resolution of 30 kHz would preferably be needed.

The frequency band to be covered follows from the fact that the antenna circuit resonance peak should preferably be within the swept range. Taking into account the fact that badly connected mechanical contacts can detune a 13.56 MHz antenna circuit from 13 MHz up to 14.5 MHz. With ±0.5 MHz margin, the frequency band to be covered is preferably [12.50, 15.0] MHz. In NFC application, the carrier frequencies sweeping range is preferably larger than 2 MHz.

Sweeping over this 2.5 MHz frequency range in 30 kHz steps, means about 80 frequency points would be needed. The target would anyhow preferably be to have both frequency range and resolution programmable, such that the detection algorithm can be tuned towards optimal performance after evaluation.

Here is a list of abbreviations used in present specification and drawings.

BIST: Built-in Self-test
LNA: low noise amplifier
FM: frequency modulation
QF: Quality factor
RF: Resonance frequency
TF: Transfer function
TX: transmitter
RX: receiver
DC: direct current
NCO: numerically controlled oscillator
LPF: low pass filter
ADC: Analogue to digital converter
PCB: printed circuit board The invention has been described with reference to preferred embodiments. However, many variations are possible within the scope of the invention.

The invention claimed is:

1. A testing method detecting misconnected mechanical contacts between an off-chip antenna and an on-chip antenna circuit, wherein the testing method is a Built-In Self-Test, the method comprising:
   measuring at least one electrical parameter representative for a state of connection of said mechanical contacts between the on-chip antenna circuit and the off-chip antenna,
   the state of connection including at least:
      the on-chip antenna circuit and the off-chip antenna being connected,
      the on-chip antenna circuit and the off-chip antenna being disconnected, and
      an imperfect connection between the on-chip antenna circuit and the off-chip antenna.

2. A testing method according to claim 1, wherein said electrical parameter is at least part of a transfer function of the on-chip antenna circuit connected to the off-chip antenna.

3. A testing method according to claim 2, wherein the testing method includes a step of evaluating the quality factor and/or the resonance frequency of the on-chip antenna circuit connected to off-chip antenna, from the measured transfer function.

4. A testing method according to claim 3, wherein the testing method includes a step of evaluating the quality factor and the resonance frequency of the on-chip antenna circuit connected to the off-chip antenna, from the measured transfer function.

5. A testing method according to claim 2, wherein said measuring step includes a substep of generating and sweeping carrier frequencies over a predetermined frequency range at an input of a transmitter of the on-chip antenna circuit and a substep of measuring an electrical signal amplitude at an output of a receiver of the on-chip antenna circuit.

6. A testing method according to claim 5, wherein the substep of sweeping carrier frequencies, is performed over a frequency range that is broader than the maximal resonance frequency detuning range of the on-chip antenna circuit being misconnected to the off-chip antenna.

7. A testing method according to claim 5, wherein, in the substep of sweeping carrier frequencies, a frequency step is separated from the subsequent frequency step by a time interval longer than T, with T=QF/RF, and with QF being the theoretical value of the quality factor and RF being the theoretical value of the resonance frequency of the on-chip antenna circuit well connected to the off-chip antenna.

8. A testing method according to claim 5, wherein, in the substep of sweeping carrier frequencies, the frequency step resolution is smaller than the frequency interval that would lead to a 0.1 dB quality factor shift.

9. A testing method according to claim 1, wherein said off-chip antenna is a Near Field Communication antenna.

10. A testing method according to claim 1, wherein the testing method includes a step of assessing the state of connection of said mechanical contacts by comparing at least one measured electrical parameter with at least one theoretical electrical parameter corresponding to a good connection between the off-chip antenna and the on-chip antenna circuit.

11. An on-chip antenna circuit comprising:
mechanical contacts configured to be connected to an off-chip antenna; and
interconnected components configured to operate in an operating mode and configured to perform a Built-In Self-Test method in a testing mode distinct from said operating mode, by measuring at least one electrical parameter representative for a state of connection of said mechanical contacts between the on-chip antenna circuit and the off-chip antenna,
said interconnected components including:
a transmitter configured to transmit a signal to the off-chip antenna connected to the on-chip antenna circuit, both in the operating mode and in the testing mode, and
a receiver configured to receive a signal from the off-chip antenna connected to the on-chip antenna circuit, in operating mode,
said transmitter being configured to have a driver current thereof replicated at an input of the receiver via a current mirror in the testing mode.

12. An on-chip antenna circuit according to claim 11, wherein the on-chip antenna circuit further comprises:
a numerically controlled oscillator configured to generate and sweep carrier frequencies over a predetermined frequency range, in the testing mode.

13. An on-chip antenna circuit according to claim 12, wherein the receiver of the on-chip antenna circuit comprises:
an input configured to be connected to the off-chip antenna, both in the operating and testing modes,
a mixer configured to mix the signal from said input with a signal from the numerically controlled oscillator, in order to down-modulate said signal from said input to a baseband signal, both in the operating and testing modes,
an envelope detector configured to filter signals received from the mixer, in order to extract baseband signals, in both the operating and testing modes,
an analogue-to-digital converter configured to receive signals from said envelope detector, both in the operating and testing modes,
an output configured to output signals from the analogue-to-digital converter, in both the operating and testing modes.

14. An on-chip antenna circuit according to claim 11, wherein all on-chip analogue components of the on-chip antenna circuit, used in the testing mode, are also used in the operating mode.

15. An on-chip antenna circuit comprising:
mechanical contacts configured to be connected to an off-chip antenna; and
interconnected components configured to operate in an operating mode and configured to perform a Built-In Self-Test method in a testing mode distinct from said operating mode, by measuring at least one electrical parameter representative for a state of connection of said mechanical contacts between the on-chip antenna circuit and the off-chip antenna,
said interconnected components including:
a transmitter configured to transmit a signal to the off-chip antenna connected to the on-chip antenna circuit, both in the operating mode and in the testing mode,
a receiver configured to receive a signal from the off-chip antenna connected to the on-chip antenna circuit, in operating mode, and
a numerically controlled oscillator configured to generate and sweep carrier frequencies over a predetermined frequency range, in the testing mode.

16. An on-chip antenna circuit according to claim 15, wherein the receiver of the on-chip antenna circuit comprises:
an input configured to be connected to the off-chip antenna, both in the operating and testing modes,
a mixer configured to mix the signal from said input with a signal from the numerically controlled oscillator, in order to down-modulate said signal from said input to a baseband signal, both in the operating and testing modes,
an envelope detector configured to filter signals received from the mixer, in order to extract baseband signals, in both the operating and testing modes,
an analogue-to-digital converter configured to receive signals from said envelope detector, both in the operating and testing modes,
an output configured to output signals from the analogue-to-digital converter, in both the operating and testing modes.

* * * * *